United States Patent
Lee

(10) Patent No.: US 8,143,626 B2
(45) Date of Patent: Mar. 27, 2012

(54) CMOS IMAGE SENSOR HAVING DOUBLE GATE INSULATOR THEREIN

(75) Inventor: Ju-Il Lee, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 32 days.

(21) Appl. No.: 12/723,409

(22) Filed: Mar. 12, 2010

(65) Prior Publication Data

US 2010/0163942 A1    Jul. 1, 2010

Related U.S. Application Data

(63) Continuation of application No. 11/657,908, filed on Jan. 24, 2007, now Pat. No. 7,691,663, which is a continuation-in-part of application No. 10/731,853, filed on Dec. 8, 2003, now abandoned.

(30) Foreign Application Priority Data

Apr. 30, 2003  (KR) .................. 10-2003-0027810

(51) Int. Cl.
*H01L 31/113* (2006.01)
(52) U.S. Cl. .................... 257/72; 257/E31.097
(58) Field of Classification Search .............. 257/72, 257/222, E31.097, E27.13
See application file for complete search history.

(56) References Cited

U.S. PATENT DOCUMENTS

| | | | |
|---|---|---|---|
| 5,134,489 | A | 7/1992 | Sauer |
| 5,707,487 | A | 1/1998 | Hori et al. |
| 5,780,858 | A | 7/1998 | Waechter et al. |
| 5,804,491 | A | 9/1998 | Ahn |
| 5,962,856 | A | 10/1999 | Zhao et al. |
| 6,146,795 | A | 11/2000 | Huang et al. |
| 6,169,286 | B1 | 1/2001 | Singh |
| 6,184,055 | B1 | 2/2001 | Yang et al. |
| 6,333,205 | B1 | 12/2001 | Rhodes |
| 6,362,049 | B1 | 3/2002 | Cagnina et al. |
| 6,642,543 | B1 | 11/2003 | Gamal et al. |
| 2001/0012225 | A1 | 8/2001 | Rhodes |

FOREIGN PATENT DOCUMENTS

JP   11-224942   8/1999
JP   2001-160620   6/2001

OTHER PUBLICATIONS

Japanese Patent Office, Office Action in JP patent application No. 2004-006232, dated Mar. 26, 2010 (translation attached).

*Primary Examiner* — Thomas L Dickey
(74) *Attorney, Agent, or Firm* — McAndrews, Held & Malloy Ltd.

(57) ABSTRACT

A method for manufacturing a CMOS image sensor includes: preparing a semiconductor substrate incorporating therein a p-type epitaxial layer by epitaxially growing up an upper portion of the semiconductor substrate; forming a pixel array in one predetermined location of the semiconductor substrate, the pixel array having a plurality of transistors and a photodiode therein, wherein each transistor employs a gate insulator with a thickness ranging from 40 Å to 90 Å; and forming a logic circuit in the other predetermined location of the semiconductor substrate, the logic circuit having at least one transistor, wherein the transistor employs a gate insulator with a thickness ranging from 5 Å to 40 Å.

13 Claims, 6 Drawing Sheets

CMOS IMAGE SENSOR HAVING DOUBLE GATE INSULATOR THEREIN

The present application is a Continuation of U.S. application Ser. No. 11/657,908, filed Jan. 24, 2007 now U.S. Pat. No. 7,691,663, which is a Continuation-In-Part of U.S. application Ser. No. 10/731,853, filed Dec. 8, 2003 now abandoned, which claims priority to Korean Application No. 10-2003-0027810, filed Apr. 30, 2003.

FIELD OF THE INVENTION

The present invention relates to a method for manufacturing a semiconductor device; and, more particularly, to a method for manufacturing a complementary metal oxide semiconductor (CMOS) image sensor having a double gate insulator in a pixel array with enhanced optical property and electrical property.

DESCRIPTION OF THE PRIOR ART

As is well known, a photodiode image sensor device is the most commonly used a device for detecting images. A typical photodiode image sensor device comprises a reset transistor and a light sensor region formed by a photodiode. For example, a photodiode is formed with an n-type doped region and a p-type substrate. When the photodiode image sensor is in operation, a voltage is applied to the reset transistor gate to turn on the reset transistor and to charge the N/P diode junction capacitor. The reset transistor is turned off when the charging of the N/P diode junction capacitor has reached a certain high voltage. The N/P diode generates a reverse bias to form a depletion region. When a light is projected on the N/P diode light sensor, electrons and holes are generated. These holes and electrons are separated by the electrical field of the depletion region, causing the electrons to travel in the direction of the N-type doped region to lower the voltage of the N-type doped region, whereas the holes travel in the direction of the P-type substrate.

A charge coupled device (CCD) image sensor has a high dynamic range and a low dark current. The sophistication of the current technology of the CCD image sensor allows the CCD image sensor to become the most popular image sensing device. The manufacturing for the CCD image sensor is, however, rather special. The price of the CCD image sensor is therefore very high. Moreover, the driver requires a high voltage operation, leading to problems of high power dissipation and inability of random access of memory.

Meanwhile, a complementary metal oxide semiconductor (CMOS) image sensor has the characteristics of high quantum efficiency, low read noise, high dynamic range and random access. The CMOS image sensor can combine with other control circuit, A/D converter and several signal processing circuits on a single wafer to achieve the so-called system on a chip (SOC). The progress of the technology of a CMOS image sensor, therefore, greatly reduces the cost of an image sensor device, the picture size and the power of dissipation. The CMOS image sensor is therefore recently replacing the CCD image sensor.

Referring to FIG. 1, there is provided a cross sectional view of a conventional CMOS image sensor 100 including a semiconductor substrate 110, a p-type epitaxial layer 112, a pixel array 101, a logic circuit 102 and field oxide (FOX) regions. Herein, the p-type epitaxial layer 112 is formed by epitaxially growing up an upper portion of the p-type semiconductor substrate 110. The pixel array 101 and the logic circuit 102 are isolated from each other by forming the FOX region therebetween.

In the pixel array 101, a p-well 114 is formed in a predetermined location of the p-type epitaxial layer 112 of the pixel array 101, where a drive transistor (Dx) and a select transistor (Sx) are formed in a post fabrication process. In the other predetermined location of the p-type epitaxial layer 112 in the pixel array 101, there is formed a buried photodiode (BPD), where a transfer transistor (Tx) and a reset transistor (Rx) are formed by a post fabrication process. Herein, the BPD has a PN junction of a deep n-type diffusion layer (DEEP $N^-$) and a shallow p-type diffusion layer ($P^0$), wherein the p-type diffusion layer ($P^0$) is formed on the deep n-type diffusion layer (DEEP $N^-$) by using a method such as an ion-implantation technique or the like.

One side of a gate electrode 116A of the transfer transistor (Tx) is connected to the BPD and the other side is connected to a floating diffusion region (FD), wherein the gate electrode 116A of the transfer transistor (Tx) is formed on a gate insulator 134.

In addition, one side of a gate electrode 116B of the reset transistor (Rx) is connected to the floating diffusion region (FD) and the other is connected to a power supply voltage (VDD), wherein the gate electrode 116B of the reset transistor (Rx) is formed on the gate insulator 134.

The drive transistor (Dx) and the select transistor (Sx) have each n-type lightly doped drains (N-LDD) 118 in source/drain regions 120 by ion-implanting p-type atoms into the p-well 114, while the reset transistor (Rx) and transfer transistor (Tx) have no N-LDDs therebetween. One of the source/drain regions 120 of the select transistor (Sx) plays a role as an output. A gate electrode 116C of the drive transistor (Dx) is connected to the floating diffusion region (FD). Herein, each gate insulator 134 employs a single layer in the conventional CMOS image sensor. A reference numeral 138 which is not illustrated above is sidewall spacers.

In the logic circuit 102, there is a p-well 122 for forming an n-MOSFET (n-type metal-oxide-silicon field effect transistor) 150 and an n-well 124 for forming a p-MOSFET 152, wherein the p-well 122 and the n-well 124 are disposed side by side in the p-type epitaxial layer 112. The n-MOSFET 150 has source/drain regions 126 with N-LDDs 128 by ion-implanting p-type atoms into the p-well 122 and the p-MOSFET 152 has source/drain regions 130 with P-LDDs 132 by ion-implanting n-type atoms into the n-well 124.

The conventional CMOS image sensor 100 having the single gate insulator 134 in the pixel array 101 may be applicable to device scale beyond 0.35 μm without lowering a photosensitivity and an electrical property.

However, since the conventional CMOS image sensor 100 has the single gate insulator 134 in both the pixel array 101 and the logic circuit 102 so that it is very difficult to secure desired optical property such as photosensitivity and electrical property simultaneously, the conventional CMOS image sensor 100 can be hardly applicable to the device scale less than 0.25 μm using a deep submicron technology.

SUMMARY OF THE INVENTION

It is, therefore, an object of the present invention to provide a complementary metal oxide semiconductor (CMOS) image sensor with enhanced optical property and electrical property by employing a double gate insulator in a pixel array and a single gate insulator in a logic circuit.

It is another object of the present invention to provide a method for manufacturing a CMOS image sensor with enhanced optical property and electrical property by employing a double gate insulator in a pixel array and a single gate insulator in a logic circuit.

In accordance with one aspect of the present invention, there is provided a complementary metal oxide semiconductor (CMOS) image sensor, including: a semiconductor substrate incorporating therein a p-type epitaxial layer formed by epitaxially growing up an upper portion of the semiconductor substrate; a pixel array formed in one predetermined location of a semiconductor substrate, having a plurality of transistors and active areas therein; and a logic circuit formed in the other predetermined location of the semiconductor substrate having active areas and at least one transistor for processing a signal from the pixel array, wherein a gate insulator of each transistor in the pixel array is thicker than a gate insulator of the transistor in the logic circuit.

In accordance with another aspect of the present invention, there is provided a method for manufacturing a CMOS image sensor, the method including the steps of: a) preparing a semiconductor substrate incorporating therein a p-type epitaxial layer, wherein the semiconductor substrate is divided into two parts of which one part is defined as a pixel array and the other part is defined as a logic circuit, the pixel array being isolated from the logic circuit by means of a field oxide region therebetween; b) forming a first gate insulator on a top face of the p-type epitaxial layer; c) forming a mask on a top face of the first gate insulator in the pixel array; d) removing the first gate insulator in the logic circuit by using the mask; e) removing the mask in the pixel array; f) forming the second gate insulator on the top face of the first gate insulator in the pixel array and a top face of the p-type epitaxial layer in the logic circuit; g) forming a photodiode and a plurality of transistors in the pixel array and at least one transistor in the logic circuit for processing a signal from the pixel array.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
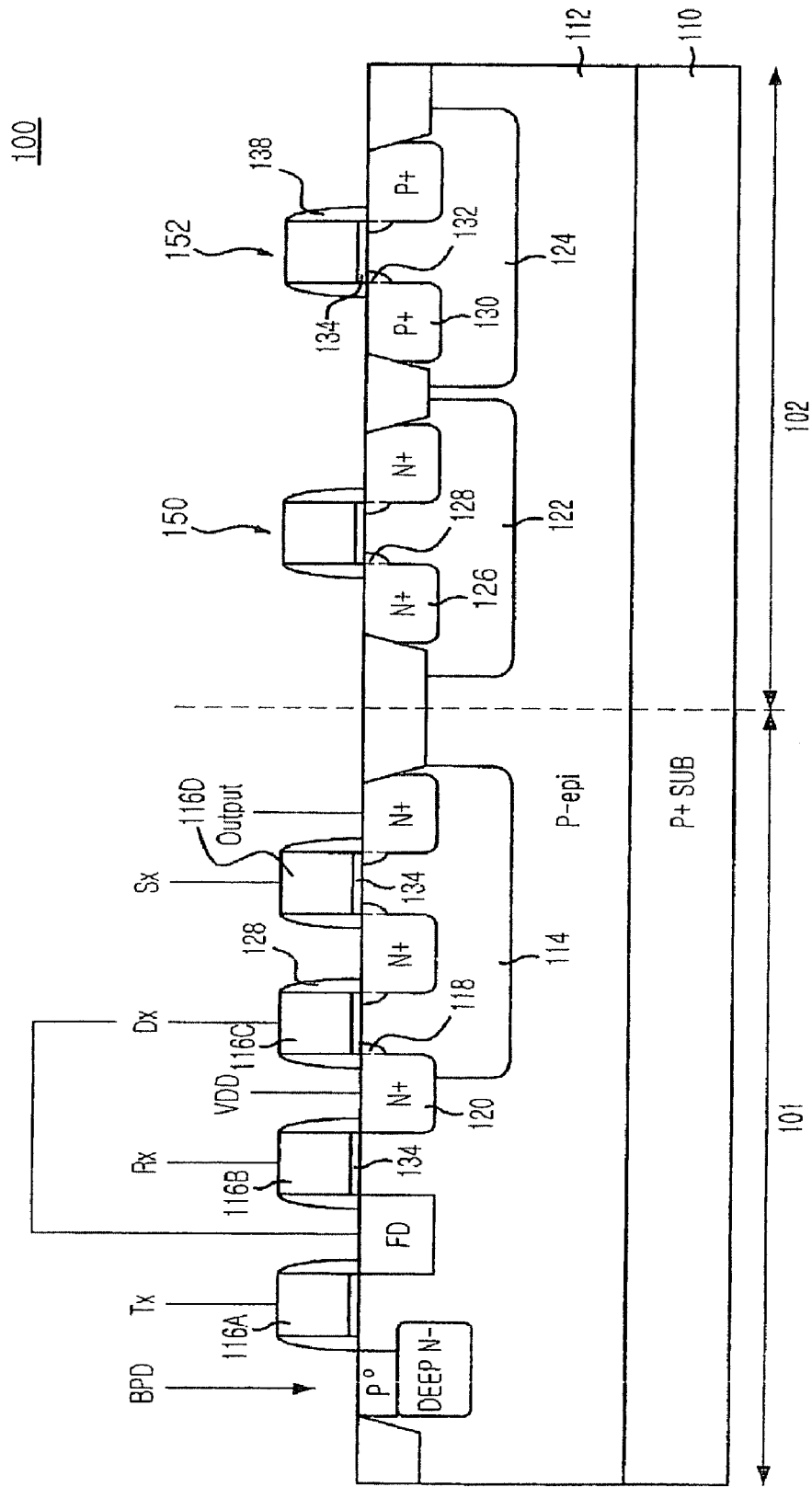
FIG. 1 is a cross sectional view setting forth a conventional complementary metal oxide semiconductor (CMOS) image sensor having a single gate insulator in a pixel array.

There are provided in FIG. 2 and FIGS. 3A to 3D cross sectional views of a complementary metal oxide semiconductor (CMOS) image sensor and cross sectional views setting forth a method for the manufacture thereof in accordance with a preferred embodiment of the present invention. It should be noted that like parts appearing in FIG. 2 and FIGS. 3A to 3D are represented by like reference numerals.

Figure 2:
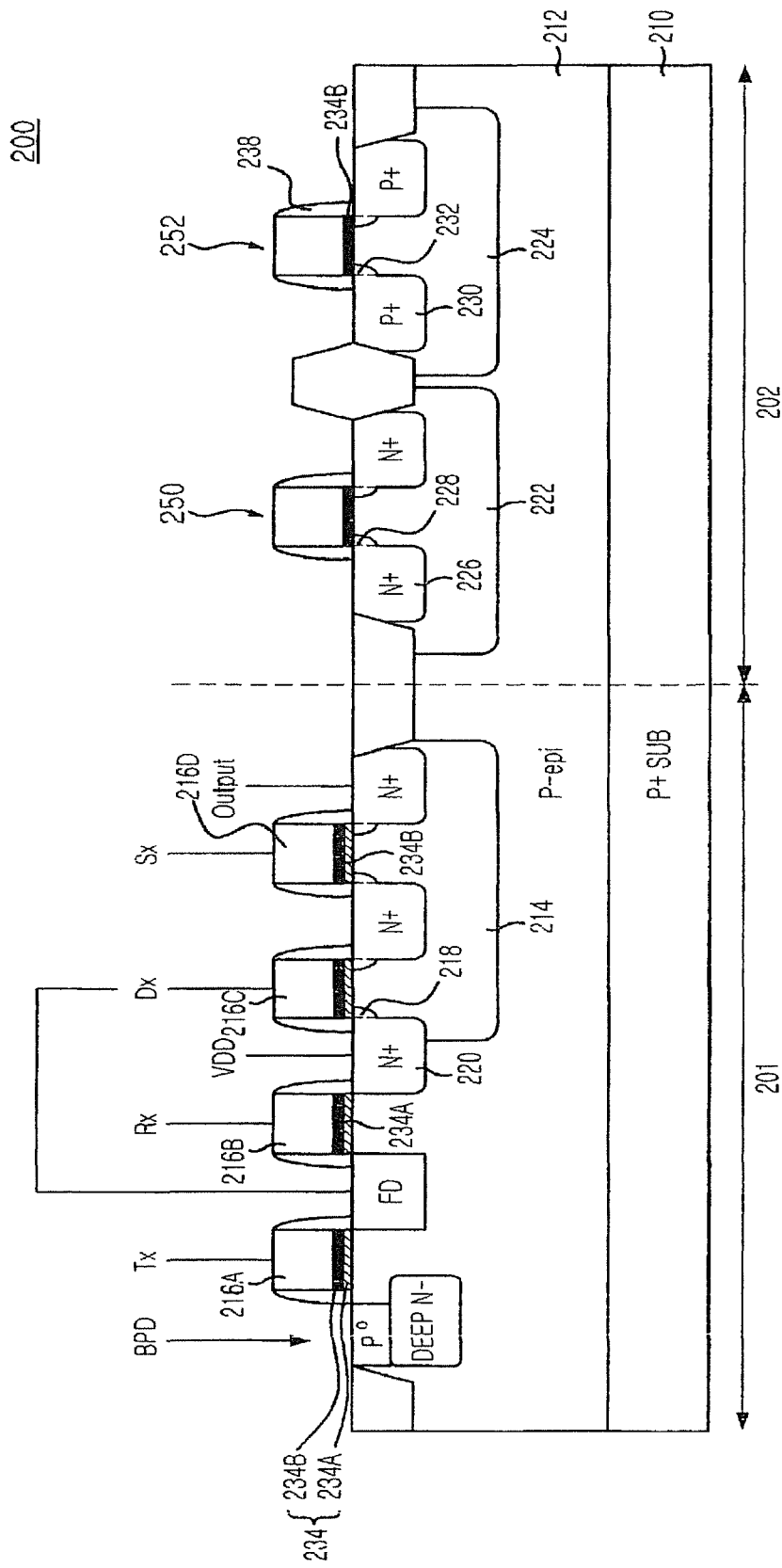
FIG. 2 is a cross sectional view setting forth a CMOS image sensor having a double gate insulator in a pixel array in accordance with a preferred embodiment of the present invention.

Referring to FIG. 2, there is provided a cross sectional view of an inventive CMOS image sensor 200 including a semiconductor substrate 210, a p-type epitaxial layer 212, a pixel array 201, a logic circuit 202 and field oxide (FOX) regions.

Herein, the p-type epitaxial layer 212 is formed by epitaxially growing up an upper portion of the p-type semiconductor substrate 210. The pixel array 201 and the logic circuit 202 are isolated from each other by forming a FOX region of a shallow trench isolation (STI) therebetween. Additionally, another FOX region of the STI formed in the logic circuit isolates elements in the logic circuit from each other.

In the pixel array 201, a p-well 214 is formed in a predetermined location of the p-type epitaxial layer 212 in the pixel array 201, where a drive transistor (Dx) and a select transistor (Sx) are formed in a post fabrication process. In the other predetermined location of the p-type epitaxial layer 212 in the pixel array, there is formed a buried photodiode (BPD), where a transfer transistor (Tx) and a reset transistor (Rx) are formed by a post fabrication process. Herein, the BPD has a PN junction of a deep n-type diffusion layer (DEEP N$^-$) and a shallow p-type diffusion layer (P$^0$), wherein the p-type diffusion layer) (P$^0$) is formed on the deep n-type diffusion layer (DEEP N$^-$) by using a method such as an ion-implantation technique or the like.

One side of a gate electrode 216A of the transfer transistor (Tx) is connected to the BPD and the other side is connected to a floating diffusion region (FD), wherein the gate electrode 216A of the transfer transistor (Tx) is formed on a double gate insulator having a first and a second gate insulators 234A, 234B.

In addition, one side of a gate electrode 216B of the reset transistor (Rx) is connected to the floating diffusion region (FD) and the other side is connected to a power supply voltage (VDD), wherein the gate electrode 216B of the reset transistor (Rx) is also formed on the double gate insulator 234.

The drive transistor (Dx) and the select transistor (Sx) have each n-type lightly doped drains (N-LDD) 218 in source/drain regions 220 by ion-implanting p-type atoms into the p-well 214, while the reset transistor (Rx) and transfer transistor (Tx) have no N-LDDs therein. One of the source/drain regions 220 of the select transistor (Sx) plays a role as an output. A gate electrode 216C of the drive transistor (Dx) is connected to the floating diffusion region (FD).

In the inventive CMOS image sensor 200, each transistor in the pixel array 201 has a gate structure of a double gate insulator 234. In detail, the first gate insulator 234A is formed on the p-type epitaxial layer 212 and the second gate insulator 234B is formed on the first gate insulator 234A. Herein, a thickness of the double gate insulator 234 is preferably in range of about 40 Å to about 90 Å.

In the logic circuit 202, there is a p-well 222 for forming an n-MOSFET (n-type metal-oxide-silicon field effect transistor) 250 and an n-well 224 for forming a p-MOSFET 252, wherein the p-well 222 and the n-well 224 are disposed side by side in the p-type epitaxial layer 212. The n-MOSFET 250 has source/drain regions 226 with N-LDDs 228 by ion-implanting p-type atoms into the p-well 222 and the p-MOSFET 252 has source/drain regions 230 with P-LDDs 232 by ion-implanting n-type atoms into the n-well 224.

Unlike the gate structure of each transistor in the pixel array 201, each transistor in the logic circuit 202 has a single gate insulator, i.e., the second gate insulator 234B. The thickness of the single gate insulator is in the range of about 5 Å to about 40 Å.

Referring to FIGS. 3A to 3D, there are shown cross sectional views setting forth a method for manufacturing a CMOS image sensor 200 in accordance with a preferred embodiment of the present invention.

Figure 3A:
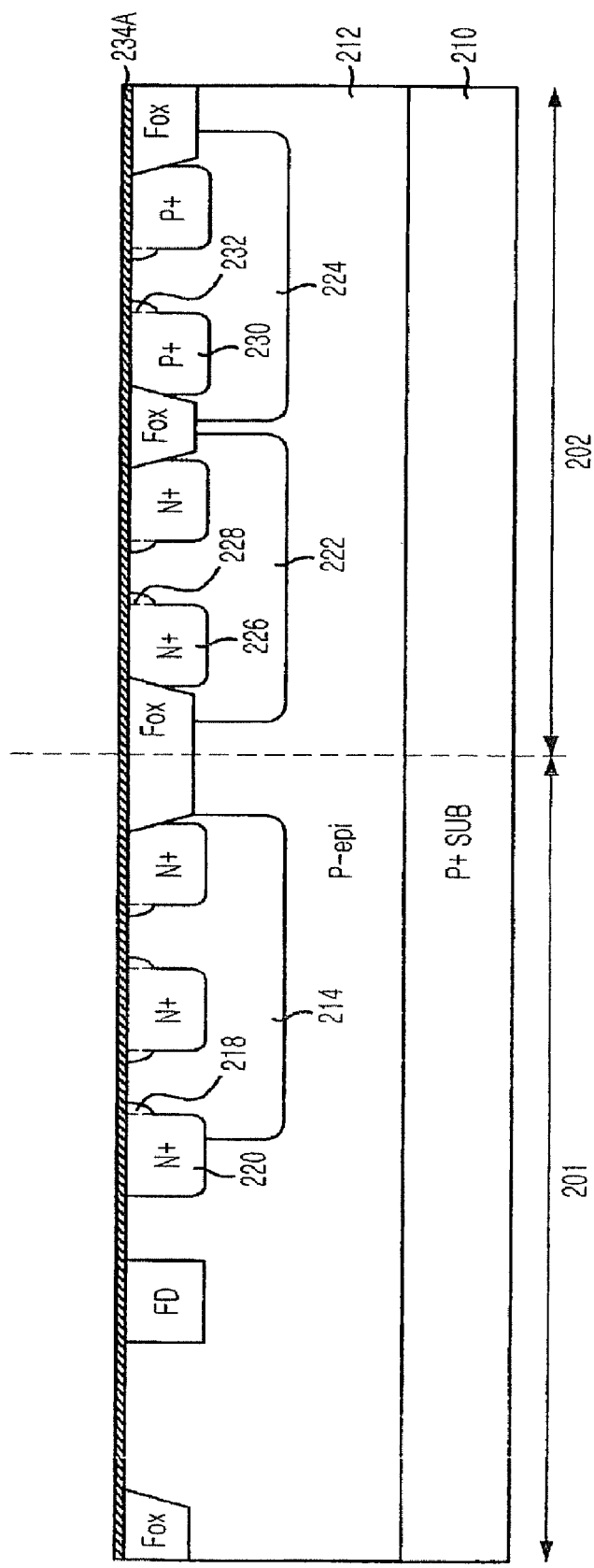
FIGS. 3A to 3D are cross sectional views setting forth a method for manufacturing a CMOS image sensor having a double gate insulator in a pixel array in accordance with a preferred embodiment of the present invention.

In FIG. 3A, the inventive method for manufacturing the CMOS image sensor 200 begins with preparing a p-type semiconductor substrate 210 incorporating therein a p-type epitaxial layer 212 formed by epitaxially growing up an upper portion of the semiconductor substrate 210, wherein the semiconductor substrate 210 is divided into two parts of which one is a pixel array 201 and the other is a logic circuit 202.

Thereafter, a field oxide (FOX) region is formed in a predetermined location of the p-type epitaxial layer 212 disposed between the pixel array 201 and the logic circuit 202 by using a method such as a shallow trench isolation (STI) process or the like, for isolating the pixel array from the logic circuit. Then, a first p-well 214 is formed in the p-type epitaxial layer 212 of the pixel array 201 by using a method such as an ion-implantation process or the like. In the logic circuit 202, there is formed a second p-well 222 and an n-well 224 by using a similar method for forming the first p-well 214.

Subsequently, a first gate insulator 234A is formed on a top face of the p-type epitaxial layer 212, wherein the first gate insulator 234A can employ silicon oxide ($SiO_2$) by thermally oxidizing the p-type epitaxial layer 212.

Figure 3B:
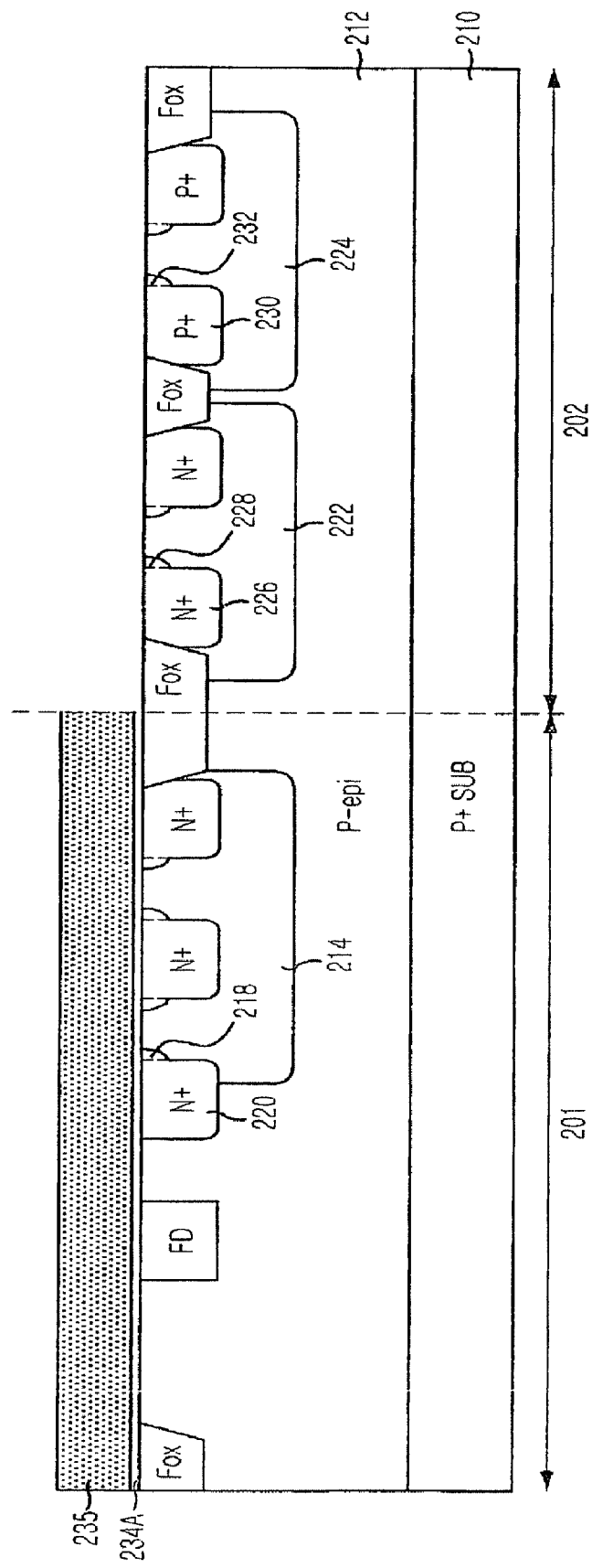

In an ensuing step, referring to FIG. 3B, a mask layer, e.g., a photosensitive film, is formed on a top face of the first gate insulator 234A and is patterned into a predetermined configuration through a light exposure and a development processes, thereby forming a mask 235 formed only on the top face of the first gate insulator 234A in the p-type epitaxial layer 212 of the pixel array 201. Next, the first gate insulator 234A in the logic circuit 202 is wet-etched by using the mask 235 as an etch mask, whereby the first gate insulator 234A remains only on the top face of the p-type epitaxial layer 212 of the pixel array 201. Herein, a wet-etching process is carried out by using hydrofluoric acid (HF), buffered oxide etchant (BOE) or the like.

Figure 3C:
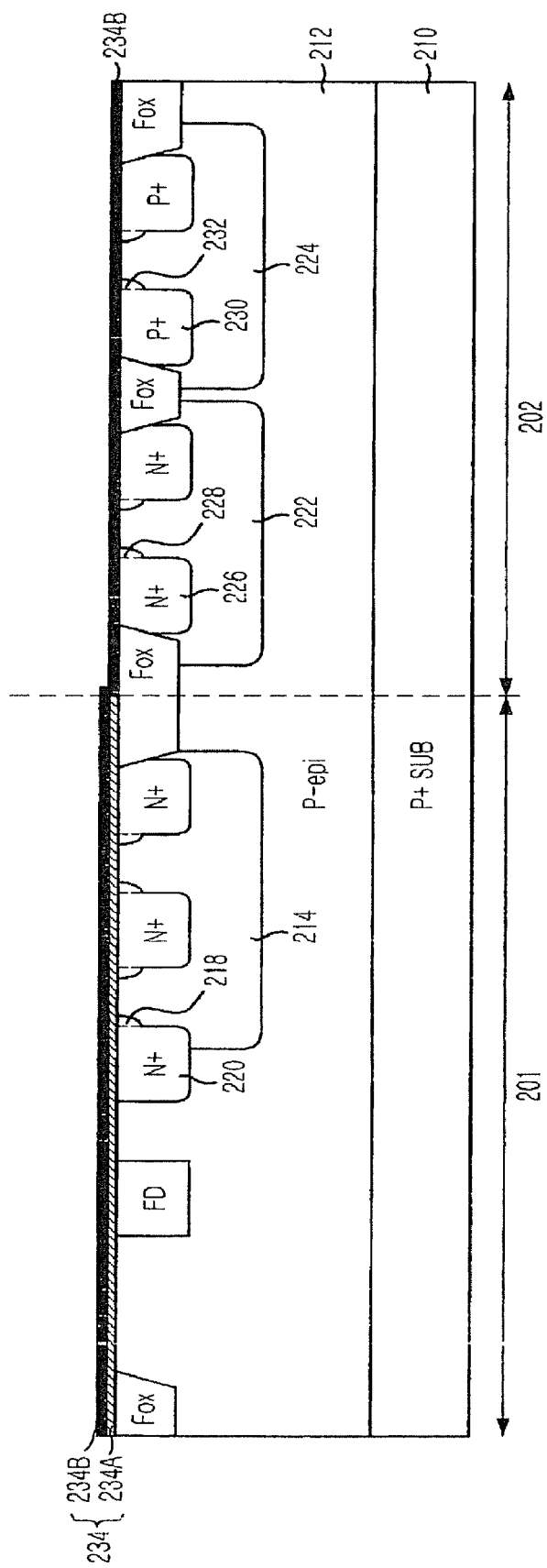

In a next step, referring to FIG. 3C, the mask 235 is removed by means of a predetermined etching process such as a dry etching process making use of an oxygen ($O_2$) plasma, a wet etching process making use of a sulfuric acid ($H_2SO_4$), an etching process making use of a thinner or the like. Thereafter, a second gate insulator 234B is formed on the first gate insulator 234A and the p-type epitaxial layer 212 of the logic circuit 202. In the result, each transistor in the pixel array 201 has a thick double gate insulator 234 while each transistor in the logic circuit 202 has a single layer of the second gate insulator 234B. Herein, it is preferable to form the thick double gate insulator 234 with the thickness ranging from about 40 Å to about 90 Å and the single layer of the second gate insulator 234B with the thickness ranging from about 5 Å to about 40 Å.

Figure 3D:
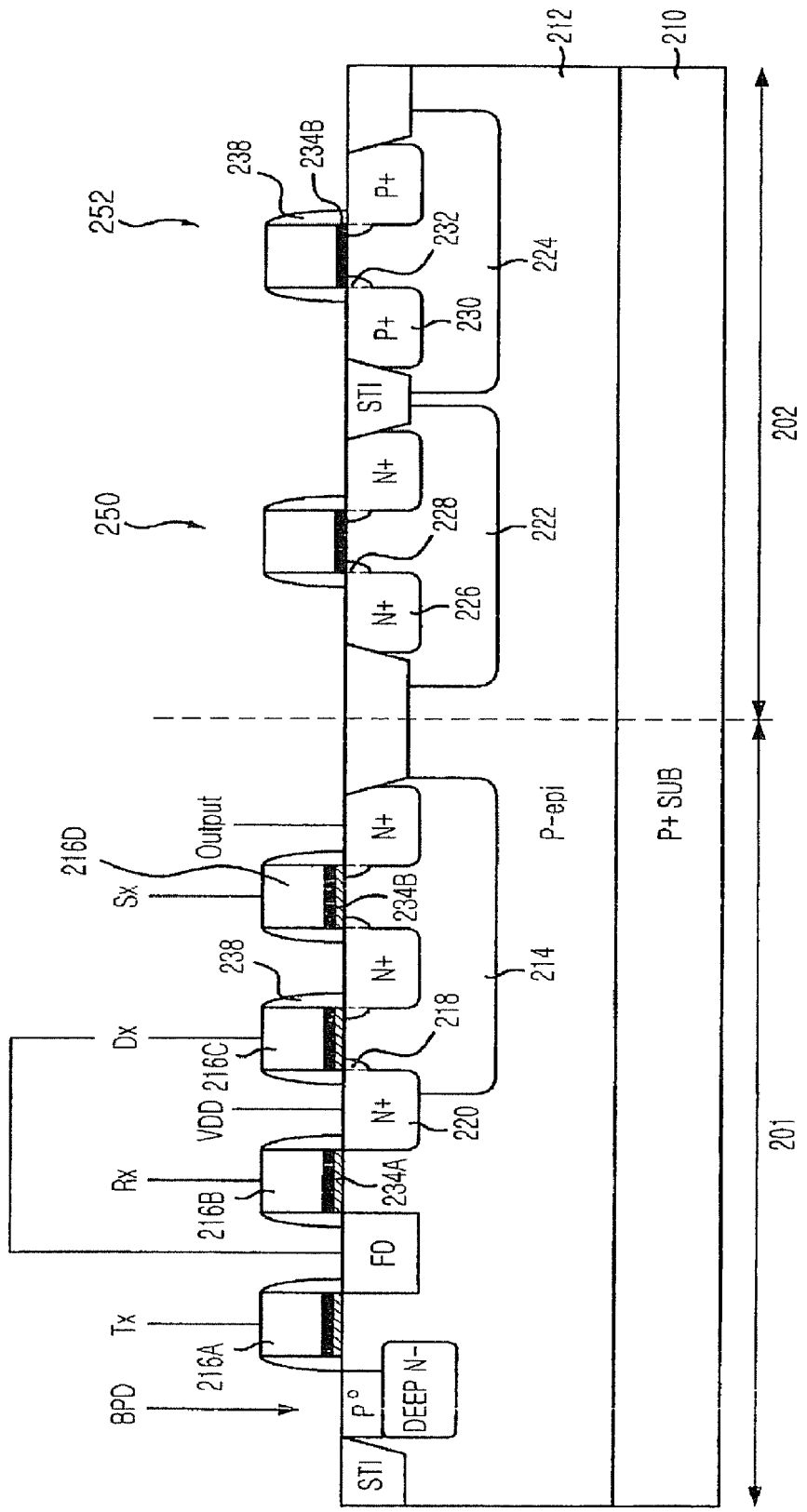

Finally, referring to FIG. 3D, a buried photodiode (BPD), a transfer transistor (Tx), a reset transistor (Rx), a drive transistor (Dx) and a select transistor (Sx) are formed in the pixel array 201. In addition, an n-MOSFET 250 and a p-MOSFET 252 are formed in the logic circuit 202. Therefore, an inventive CMOS image sensor 200 is achieved. Herein, the processes for fabricating above transistors and MOSFETs are well-known to those skilled in the art, so further explanation will be abbreviated in the present invention.

As aforementioned already, the inventive CMOS image sensor 200 employs the double gate insulator 234 in the pixel array 201 compared with the conventional CMOS image sensor 100 employing a single gate insulator therein. Therefore, the inventive CMOS image sensor 200 has an advantage that it is possible to apply high operating voltage ranging from about 2.5 V to 3.3 V so as to secure sufficient saturated charges due to the thick double gate insulator 234 in the pixel array 201. In addition, it is also possible to secure an appropriate dynamic range because of the sufficient saturated charges.

Furthermore, it is possible to reduce the capacitance of the floating diffusion region (FD) by reducing the capacitance of the gate insulator 234 of the drive transistor (Dx) which is connected to the floating diffusion region (FD). In addition, an increase of an electron-voltage conversion gain results in improving a photosensitivity of the CMOS image sensor 200.

Meanwhile, there is employed a single gate insulator, i.e., the second gate insulator 234B, in the logic circuit 202 so that it is possible to apply low operating voltage less than 1.8 V, to thereby reducing power dissipation. Accordingly, the inventive CMOS image sensor 200 can be applicable to a portable manufactures such as a mobile phone, a digital camera or the like which requires high speed and high efficiency property.

While the present invention has been described with respect to the particular embodiments, it will be apparent to those skilled in the art that various changes and modifications may be made without departing from the scope of the invention as defined in the following claims.

What is claimed is:

1. A complementary metal-oxide semiconductor (CMOS) image sensor, comprising:
   a semiconductor substrate having a pixel array area and a logic circuit area, wherein the pixel array area is bounded by the logic circuit area and is isolated from the logic circuit area by a field oxide region;
   a pixel array formed in the pixel array area of the semiconductor substrate, wherein the pixel array includes a plurality of MOSFET transistors each having a gate with a gate insulating layer; and
   a logic circuit formed in the logic circuit area of the semiconductor substrate, wherein the logic circuit is configured to process signals received from the pixel array, and wherein the logic circuit includes a plurality of MOSFET transistors each having a gate with a gate insulating layer;
   wherein the gate insulating layers of all MOSFET transistors in the pixel array are thicker than the gate insulating layers of each MOSFET transistor in the logic circuit.

2. The CMOS image sensor of claim 1, wherein each MOSFET transistor in the pixel array includes, as its gate insulating layer, a double layer of insulating material, and wherein each MOSFET transistor in the logic circuit includes, as its gate insulating layer, a single layer of insulating material.

3. The CMOS image sensor of claim 2, wherein the single layer of insulating material has a thickness ranging from about 10 Å to about 40 Å, and wherein the double layer of insulating material has a thickness ranging from about 40 Å to about 90 Å.

4. The CMOS image sensor of claim 1, wherein the semiconductor substrate includes a p-type epitaxial layer having doped regions configured to form the plurality of MOSFET transistors in the pixel array, and wherein the gate insulating layers of the plurality of MOSFET transistors in the pixel array include a layer of thermally-oxidized silicon oxide (SiO2) formed over the p-type epitaxial layer.

5. A complementary metal-oxide semiconductor (CMOS) image sensor, comprising:
   a semiconductor substrate including a pixel array area and a logic circuit area located adjacent the pixel array area, wherein the pixel array area and logic circuit area are isolated from one another by an isolation region;
   pixel sensors formed by MOSFET transistors in the pixel array area and arranged in a pixel array, wherein all of the MOSFET transistors in the pixel array area have a gate with a gate insulating layer of a first thickness; and a logic circuit formed by MOSFET transistors in the logic circuit area, wherein the logic circuit is configured to process signals received from the pixel array, and wherein the MOSFET transistors in the logic circuit area have gates with gate insulating layers of a second thickness;

wherein the first thickness is greater than the second thickness.

6. The CMOS image sensor of claim 5, wherein each MOSFET transistor forming the pixel sensors in the pixel array includes, as its gate insulating layer, a double layer of insulating material having the first thickness, and wherein some of the MOSFET transistors forming the logic circuit include, as their gate insulating layer, a single layer of insulating material having the second thickness.

7. The CMOS image sensor of claim 2, wherein the single layer of insulating material has a thickness ranging from about 10 Å to about 40 Å, and wherein the double layer of insulating material has a thickness ranging from about 40 Å to about 90 Å.

8. The CMOS image sensor of claim 5, wherein each MOSFET transistor in the pixel array includes, as its gate insulating layer, a double layer of insulating material, and wherein each MOSFET transistor in the logic circuit includes, as its gate insulating layer, a single layer of insulating material.

9. The CMOS image sensor of claim 5, wherein the second thickness has a range from about 10 Å to about 40 Å, and wherein the first thickness has a range from about 40 Å to about 90 Å.

10. The CMOS image sensor of claim 5, wherein the isolation region comprises a field oxide surrounding the pixel array area.

11. An image sensor, comprising:
a semiconductor substrate having a logic circuit region including a logic circuit and a pixel array region including a pixel array circuit, wherein the logic circuit region and pixel array region are immediately proximate one another and isolated by a field oxide region;
a plurality of MOSFET transistors configured to form the logic circuit in the logic circuit region; and
a plurality of MOSFET transistors configured to form the pixel array circuit in the pixel array region, wherein the plurality of MOSFET transistors of the logic circuit are electrically connected to the plurality of MOSFET transistors configured to form the pixel array circuit to thereby process signals received from the pixel array circuit;
wherein each of the plurality of MOSFET transistors configured to form the logic circuit includes a gate insulating layer having a first layer thickness, wherein all of the plurality of MOSFET transistors configured to form the pixel array circuit include a gate insulating layer having a second layer thickness, and wherein the first layer thickness is less than the second layer thickness.

12. The image sensor of claim 11, wherein the second layer thickness is approximately twice the first layer thickness.

13. The image sensor of claim 11, wherein the first layer thickness has a thickness ranging from about 10 Å to about 40 Å, and wherein the second layer thickness has a thickness ranging from about 40 Å to about 90 Å.

* * * * *

UNITED STATES PATENT AND TRADEMARK OFFICE
CERTIFICATE OF CORRECTION

PATENT NO. : 8,143,626 B2  
APPLICATION NO. : 12/723409  
DATED : March 27, 2012  
INVENTOR(S) : Lee Page 1 of 1

It is certified that error appears in the above-identified patent and that said Letters Patent is hereby corrected as shown below:

In Column 2, Line 28, delete "(N-LDD)" and insert -- (N-LDDs) --, therefor.

In Column 4, Line 18, delete "layer)" and insert -- layer --, therefor.

In Column 4, Line 33, delete "(N-LDD)" and insert -- (N-LDDs) --, therefor.

In Column 6, Line 57, in Claim 4, delete "(SiO2)" and insert -- (SiO$_2$) --, therefor.

In Column 7, Line 15, in Claim 7, delete "2," and insert -- 6, --, therefor.

In Column 8, Line 27, in Claim 13, delete "Åto" and insert -- Å to --, therefor.

In Column 8, Line 29, in Claim 13, delete "Åto" and insert -- Å to --, therefor.

Signed and Sealed this  
Fourteenth Day of August, 2012

David J. Kappos  
*Director of the United States Patent and Trademark Office*